(12) United States Patent
Fong et al.

(10) Patent No.: US 7,687,870 B2
(45) Date of Patent: Mar. 30, 2010

(54) LATERALLY CONFIGURED ELECTROOPTICAL DEVICES

(75) Inventors: Hon Hang Fong, Ithaca, NY (US); George G. Malliaras, Ithaca, NY (US); Kiyotaka Mori, Cambridge (GB)

(73) Assignees: Panasonic Corporation, Osaka (JP); Cornell Research Foundation, Inc., Ithaca, NY (US)

( * ) Notice: Subject to any disclaimer, the term of this patent is extended or adjusted under 35 U.S.C. 154(b) by 242 days.

(21) Appl. No.: 11/648,317

(22) Filed: Dec. 29, 2006

(65) Prior Publication Data

US 2008/0157105 A1 Jul. 3, 2008

(51) Int. Cl.
*H01L 31/0232* (2006.01)
*H01L 31/00* (2006.01)
*H01L 31/06* (2006.01)
*H01L 29/739* (2006.01)
*H01L 31/0328* (2006.01)
*H01L 31/0336* (2006.01)
*H01L 31/072* (2006.01)
*H01L 31/109* (2006.01)
*H01L 29/732* (2006.01)
*H01L 29/22* (2006.01)
*H01L 33/00* (2006.01)
*H01L 27/15* (2006.01)
*H01L 29/26* (2006.01)
*H01L 31/12* (2006.01)
*H01L 29/06* (2006.01)

(52) U.S. Cl. .................. 257/432; 257/13; 257/21; 257/79; 257/94; 257/184; 257/186; 257/199; 257/448; 257/461; 257/E29.144; 257/E29.145; 257/E29.147; 257/E29.149; 257/E31.124; 257/E33.062

(58) Field of Classification Search ................. 257/186, 257/199, 448, 13, 21, 79, 94, 184, 461, E29.144, 257/E29.145, E29.147, E29.149, E31.124, 257/E33.062
See application file for complete search history.

(56) References Cited

U.S. PATENT DOCUMENTS 4,486,767 A * 12/1984 Fraleux et al. ................. 349/49
5,212,395 A * 5/1993 Berger et al. ................. 257/185
6,720,584 B2 * 4/2004 Hata et al. ..................... 257/98

(Continued)

FOREIGN PATENT DOCUMENTS

EP 717438 A2 * 6/1996

(Continued)

*Primary Examiner*—Ida M Soward
(74) *Attorney, Agent, or Firm*—RatnerPrestia

(57) ABSTRACT

A laterally configured electrooptical device including: a substrate having a surface; a first semiconductor layer of a first type semiconductor material; a second semiconductor layer formed of a second type semiconductor material different from the first type semiconductor material; a first electrode; and a second electrode. The lower surface of the first semiconductor layer is coupled to a section of the surface of the substrate. The lower surface of the second semiconductor layer is coupled to the upper surface of the first semiconductor layer to form a junction. The first electrode is directly electrically coupled to one side of the first semiconductor layer and the second electrode is directly electrically coupled to an opposite side of the second semiconductor layer. These electrodes are configured such that the lower surface of the first semiconductor layer and/or the upper surface of the second semiconductor layer are substantially unoccluded by them.

26 Claims, 3 Drawing Sheets

U.S. PATENT DOCUMENTS

| | | | |
|---|---|---|---|
| 6,757,311 B2 * | 6/2004 | Abe | 372/43.01 |
| 6,815,790 B2 * | 11/2004 | Bui et al. | 257/459 |
| 6,963,089 B2 * | 11/2005 | Shi et al. | 257/186 |
| 2004/0149331 A1 * | 8/2004 | Sharps et al. | 136/255 |
| 2006/0072639 A1 * | 4/2006 | Johnson et al. | 372/43.01 |
| 2006/0076650 A1 * | 4/2006 | Osawa | 257/620 |

FOREIGN PATENT DOCUMENTS

WO    WO 2005/069400      7/2005

* cited by examiner

LATERALLY CONFIGURED ELECTROOPTICAL DEVICES

FIELD OF THE INVENTION

The present invention concerns electrooptical devices that are laterally configured so that the electrodes do not occlude semiconductor material of the devices. These laterally configured electrooptical devices may allow for the production of more efficient electrooptical devices. In particular, the optical output of electroluminescent devices and the current output of photovoltaic devices may be increased.

BACKGROUND OF THE INVENTION

Present light emitting diode and/or photovoltaic devices are typically formed vertically on substrates, i.e. the layers (cathode, anode, semiconductor) are fabricated on top of one another so as to be stacked normal to the substrate. This is done because it is easier to fabricate a large PN junction region in this manner.

However, in this configuration, the layers of the semiconductor material are typically relatively thick, typically >>100 nm, to substantially avoid short circuits in the electrooptical device. This is because of the potential for voids in overly thin semiconductor layers that may allow an electrode formed on top of the semiconductor layer(s) to contact an electrode formed below the semiconductor layer(s). Due to these thick semiconductor layers, the efficiency of typical electrooptical devices is decreased due to light blocked by the electrode. Also, in photovoltaic (PV) devices, the excess thickness of the semiconductor may lead to significant loss due to charge recombination before the charge can be separated by the junction; and, in electroluminescent (EL) devices, photons may be reabsorbed before they traverse the thick semiconductor material layer(s). In addition, if the stacked structure includes a charge generation layer (electrode), this layer may cause processing difficulties and/or may block incoming or outgoing light.

Exemplary embodiments of the present invention overcome these and other issues associated with the fabrication of electrooptical devices.

SUMMARY OF THE INVENTION

An exemplary embodiment of the present invention is a laterally configured electrooptical device including: a substrate having a surface; a first semiconductor layer of a first type semiconductor material; a second semiconductor layer formed of a second type semiconductor material different from the first type semiconductor material; a first electrode electrically coupled to the first semiconductor layer; and a second electrode electrically coupled to the second semiconductor layer. The semiconductor layers each have a first side, a second side, an upper surface, and a lower surface. The lower surface of the first semiconductor layer is coupled to a section of the surface of the substrate. The lower surface of the second semiconductor layer is coupled to the upper surface of the first semiconductor layer to form a junction. The first sides of the semiconductor layers are adjacent and so are the second sides. The first electrode is directly electrically coupled to the first side of the first semiconductor layer and the second electrode is directly electrically coupled to the second side of the second semiconductor layer. These electrodes are configured such that at least one of the lower surface of the first semiconductor layer or the upper surface of the second semiconductor layer is substantially unoccluded by them.

Another exemplary embodiment of the present invention is a laterally configured electrooptical device including: a first semiconductor sheet of a first type semiconductor material; a second semiconductor sheet formed of a second type semiconductor material different from the first type semiconductor material; a first electrode electrically coupled to the first semiconductor sheet; and a second electrode electrically coupled to the second semiconductor sheet. The semiconductor sheets each have a first surface, a second surface opposite the first surface, a first edge substantially perpendicular to the first surface, and a second edge opposite the first edge and substantially perpendicular to the first surface. The semiconductor sheets are arranged such that: the first surface of the second semiconductor sheet is coupled to the second surface of the first semiconductor sheet to form a junction; the first sides of the semiconductor sheets are adjacent to each; and so are the second sides. The first electrode is directly electrically coupled to the first side of the first semiconductor sheet and the second electrode is directly electrically coupled to the second side of the second semiconductor sheet. These electrodes are configured such that at least one of the lower surface of the first semiconductor sheet or the upper surface of the second semiconductor sheet is substantially unoccluded by them.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures.

DETAILED DESCRIPTION OF THE INVENTION

Exemplary embodiments of the present invention involve exemplary laterally configured electrooptical devices. These exemplary techniques allow for the fabrication of photovoltaic (PV) and electroluminescent (EL) devices having thin semiconductor layers and large area PN junctions that are not occluded by electrodes.

Exemplary PV devices according to the present invention may be used as solar cells for energy production. Alternatively, these exemplary PV devices may be used in light sensor applications including as feedback for EL devices such as displays. Exemplary EL devices according to the present invention may be used in applications such as lighting, displays, and so on. One advantage of these exemplary devices is that, using exemplary lateral configurations of the present invention, it may be possible to produce thinner devices. In exemplary PV devices, the thinner layers may allow more of the incoming light to be incident on the charge generation layer (semiconductor) and may allow more charge carriers to be collected before they recombine. In exemplary EL devices, the thinner layers may allow more of the generated light to be emitted. Exemplary electrooptical device configurations of the present invention may also allow for stacking devices while maintaining high area efficiency in either PV or EL applications. Additionally, these exemplary structures may prove particularly compatible with a gate to allow the cell to be tuned.

Figure 1:
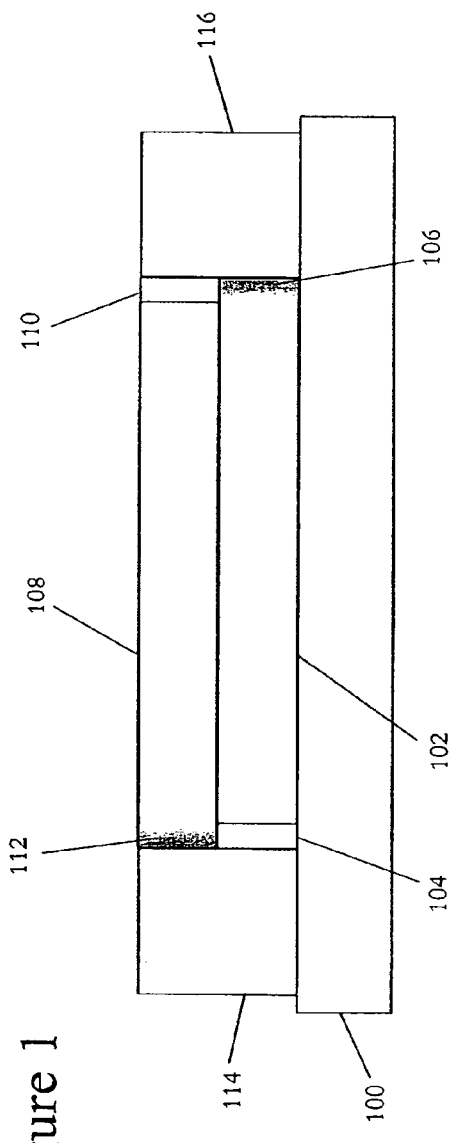
FIG. 1 is a side plan drawing illustrating an exemplary laterally configured electrooptical device according to the present invention.

FIG. 1 illustrates an exemplary embodiment of the present invention. This exemplary embodiment is a laterally configured electrooptical device that includes: substrate 100; first semiconductor layer 102; second semiconductor layer 108; and electrodes 114 and 116. In exemplary embodiments of the present invention, first semiconductor layer 102, second semiconductor layer 108, first electrode 114 and second electrode 116 are configured such that first electrode 114 and second electrode 116 do not occlude the upper surface of second semiconductor layer 108, allowing for improved propagation of radiation into and/or out of the exemplary electrooptical device. In other exemplary embodiments of the present invention, first semiconductor layer 102, second semiconductor layer 108, first electrode 114 and second electrode 116 are configured such that first electrode 114 and second electrode 116 do not occlude the lower surface of first semiconductor layer 102, allowing for improved propagation of radiation into and/or out of the exemplary electrooptical device through substrate 100.

First semiconductor layer 102 has a first side (adjacent to first electrode 114), a second side (adjacent to second electrode 116), an upper surface (that forms the junction with second semiconductor layer 108), and a lower surface (coupled to substrate 100). Second semiconductor layer 108 has a first side (adjacent to first electrode 114), a second side (adjacent to second electrode 116), an upper surface, and a lower surface (that forms the junction with first semiconductor layer 102).

Substrate 100 may desirably be formed of materials selected such that first semiconductor layer 102 may adhere to the top surface of substrate 100, for example an acrylic substrate may be desirable if the first semiconductor layer is formed of an organic semiconducting material, whereas an intrinsic silicon substrate may be more desirable for a silicon first semiconductor layer. In exemplary electrooptical devices of the present invention designed such that radiation is coupled into and/or out of the exemplary device through substrate 100, it is also desirable for substrate 100 to be substantially transmissive to the radiation. Additionally, in cases where first semiconductor layer 102 is formed of a crystalline material, it may be desirable for the top surface of substrate 100 to be substantially lattice matched to the first semiconductor layer.

Figure 2:
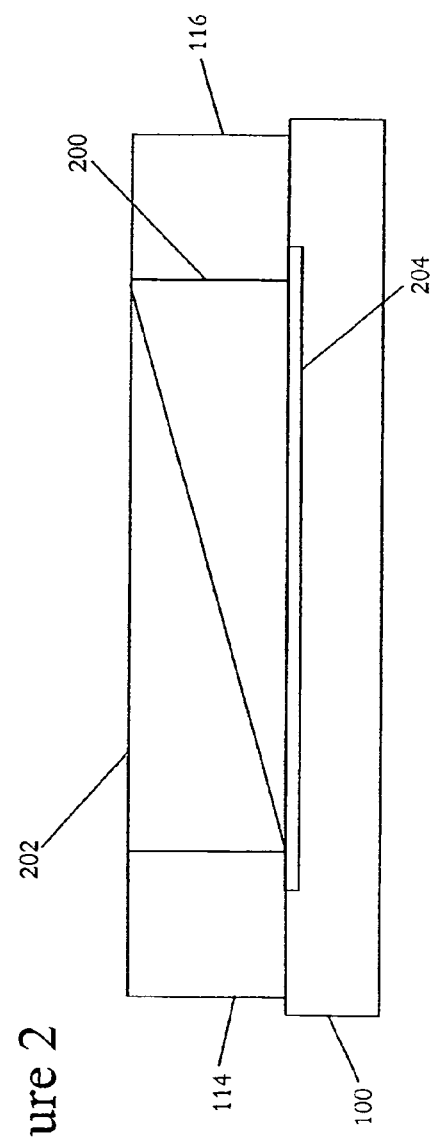
FIG. 2 is a side plan drawing illustrating another exemplary laterally configured electrooptical device according to the present invention.

Further, substrate 100 may be formed to include multiple layers. For example, FIG. 2 illustrates an exemplary electrooptical device in which substantially reflective layer 204 is formed as part of (or on top of) substrate 100. Substantially reflective layer 204 may be formed of a reflective metal layer covered by an insulating layer to prevent short circuiting the exemplary electrooptical device, or it may be a multilayer dielectric mirror. Substantially reflective layer 204 may be patterned to substantially match the area of the exemplary electrooptical device, as shown in FIG. 2, or it may cover the entire top surface of substrate 100.

Alternatively, exemplary embodiments of the present invention are contemplated in which the substrate may be removed after the laterally configured electrooptical device has been formed, using a wafer thinning or peel-off process. This exemplary electrooptical device may include features from the various exemplary embodiments described below. The resulting exemplary electrooptical devices may be thinner than similar exemplary electrooptical devices that include a substrate and may also allow for improved propagation of radiation and/or out of the exemplary device through both surfaces of the device.

Returning to FIG. 1, first semiconductor layer 102 is formed of a first type semiconductor material and second semiconductor layer 108 is formed of a second type semiconductor material that is different from the first type semiconductor material to form a junction. Exemplary semiconductor layers 102 and 108 may include a wide range of different semiconductor materials including: n-type organic semiconductor materials; p-type organic semiconductor materials; bipolar organic semiconductor materials; n-type (electron donor) inorganic semiconductor materials; p-type (electron acceptor) inorganic semiconductor materials; and intrinsic inorganic semiconductor materials. These exemplary semiconductor layers may be strained or unstrained depending on the materials chosen and the fabrication method used. The first and second type semiconductor materials may be formed from a similar base material. As examples, first semiconductor layer 102 may be formed of N-type silicon and second semiconductor layer 108 may be formed of P-type silicon; or first semiconductor layer 102 may be formed of P-type GaAs and second semiconductor layer 108 may be formed of N-type AlGaAs. However, it is not necessary for the semiconductor material to be similar, i.e. exemplary heterojunctions electrooptical devices are contemplated as well as homojunction devices. These exemplary heterojunctions electrooptical devices may include devices with inorganic/inorganic, organic/organic, and/or organic/inorganic semiconductor junctions. Additionally, first semiconductor layer 102 and/or second semiconductor layer 108 may include multiple sub-layers.

Figure 3:
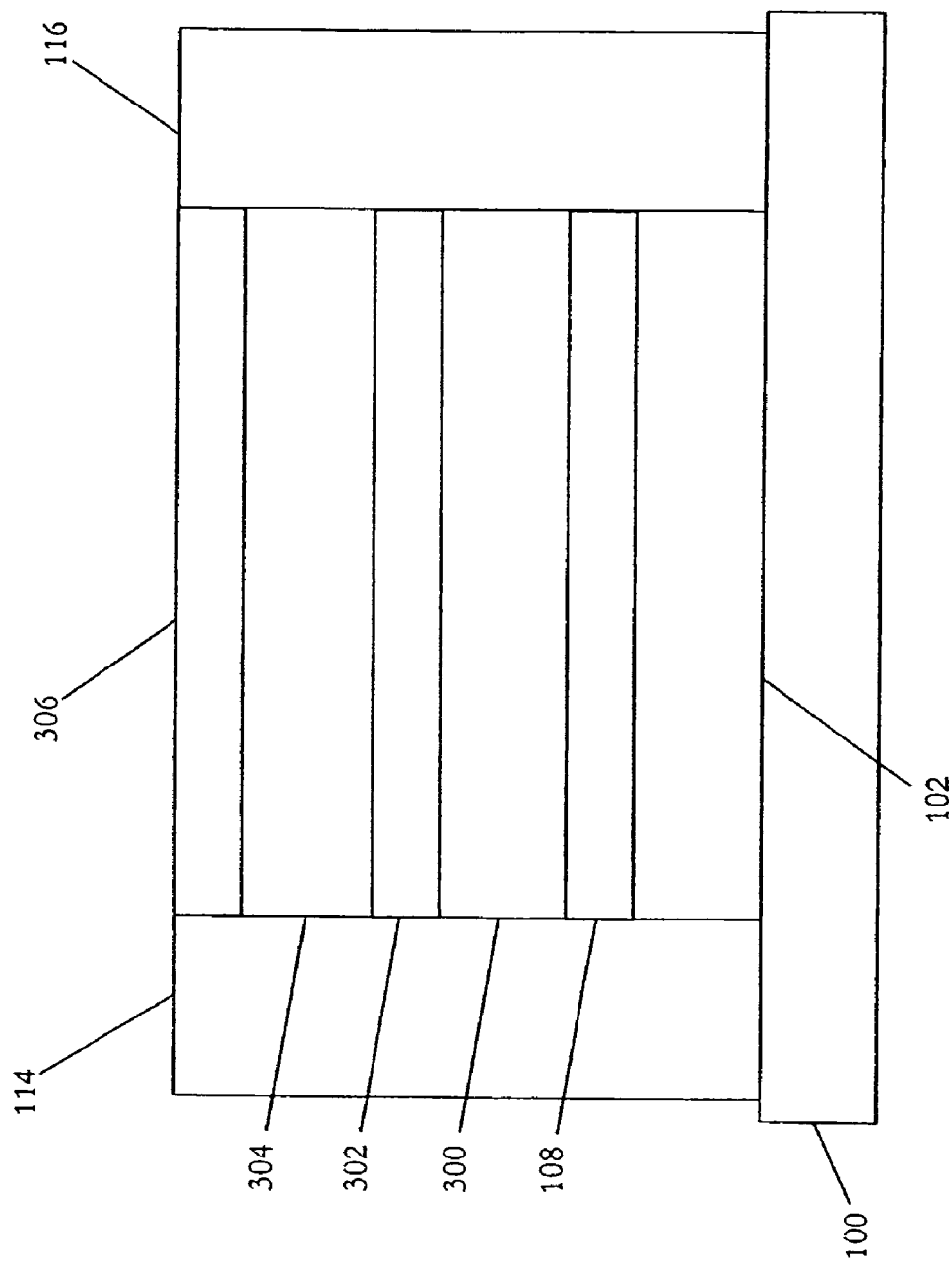
FIG. 3 is a side plan drawing illustrating an exemplary multilayer laterally configured electrooptical device according to the present invention.
Figure 4:
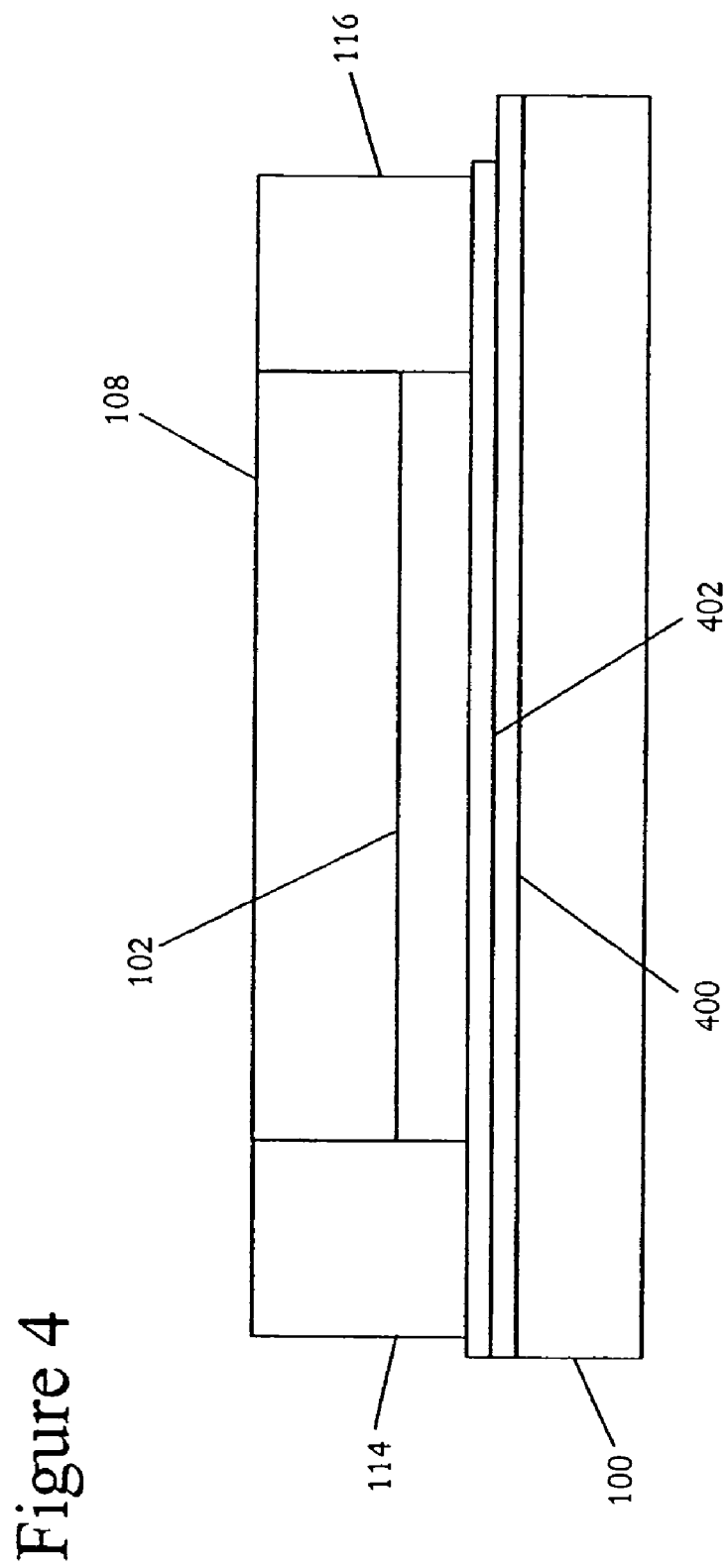
FIG. 4 is a side plan drawing illustrating an exemplary laterally configured gated electrooptical device according to the present invention.

It is noted that in FIG. 1 first semiconductor layer 102 and second semiconductor layer 108 are shown to have approximately the same thickness; however, as illustrated in FIGS. 3 and 4, this is not necessary. The thicknesses of these layers may be selected based on the desired properties of the exemplary lateral configured electrooptical device. For example, the selected thicknesses of semiconductor layers 102 and 108 may be based on the desired current density, contact resistance, and mobility of these layers.

It is further noted that, due to the exemplary lateral configuration, first semiconductor layer 102 and second semiconductor layer 108 may be formed to be very thin, possibly 100 nm or thinner, without concerns about short circuits. This is because the electrodes are formed on the sides of the exemplary device and, thus, they cannot short out the exemplary device, even if there is a defect during production and either first semiconductor layer 102 does not cover all of the underlying surface of substrate 100 or second semiconductor layer 108 does not fully cover first semiconductor layer 102. This lateral configuration, however, may lead to issues with lateral diffusion, or drift, of carriers in low mobility semiconductor material. Although, these lateral diffusion issues may limit the maximum desirable distance between electrodes 114 and 116, large area junctions may still be obtained by forming the exemplary electrooptical devices in a long line, or perhaps in a zigzag, spiral, or other pattern.

If the exemplary laterally configured electrooptical device is an EL device, the output radiation is generated by carrier recombination near the junction between first semiconductor layer 102 and second semiconductor layer 108. At least one of the first type semiconductor material or the second type semiconductor material is desirably an EL material. This EL material may include dyes or fluorescent material within the semiconductor material. The thickness of first semiconductor layer 1082, which may be less than about 100 nm, may be desirably selected to allow for efficient transmission of the generated radiation through its lower surface, and/or the thickness of second semiconductor layer 108, which may also be less than about 100 nm, may be desirably selected to allow for efficient transmission of the generated radiation through its upper surface.

If the exemplary laterally configured electrooptical device is a PV device, at least one of the first type semiconductor material or the second type semiconductor material is a PV material. Incident radiation generates photo-carriers (i.e. electron-hole pairs) in this PV material. The thickness of the semiconductor layer(s) that is (are) formed of the PV material is selected such that the junction may efficiently separate the electron-hole pairs generated in the PV material. This thickness may be less than about 100 nm.

In the exemplary embodiment of FIG. 1, the second side of first semiconductor layer 102 includes doped portion 106, which desirably forms an ohmic contact with second electrode 116 and insulating layer 104 is disposed between first electrode 114 and the first side of the first semiconductor layer 102. The first side of second semiconductor layer 108 includes a relatively heavily doped portion 112, which desirably forms an ohmic contact with first electrode 114 and insulating layer 110 is disposed between second electrode 116 and the second side of the second semiconductor layer 108. Together doped portions 106 and 112 and insulating layers 104 and 110 establish a single electrical path through the exemplary electrooptical device of FIG. 1.

Current may flow in a desired manner within the exemplary device even without these heavily doped elements. FIG. 2 illustrates an exemplary laterally configured electrooptical device in which the junction between first semiconductor layer 200 and second semiconductor layer 202 is formed at a predetermined angle to the surface of substrate 100. If, as shown in FIG. 2, this predetermined angle is approximately equal to, or greater than, the arctangent of the maximum thickness of first semiconductor layer 200 divided by its width, then each electrode may be connected to only one of the semiconductor layers.

FIGS. 3 and 4 illustrate another exemplary method of establishing an electrical path through an exemplary electrooptical device according to the present invention. In this exemplary method electrodes 114 and 116 are coupled to both semiconductor layers 102 and 108 (or, in the case of the exemplary embodiment of FIG. 3, all six semiconductor layers 102, 108, 300, 302, 304, and 306). In exemplary EL embodiments, electrons are preferentially injected into the N-type layer(s) and holes are preferentially injected into the P-type layer(s). Thus, current may be driven through junction of the exemplary EL device leading to electron-hole recombination and the emission of radiation. In exemplary PV embodiments, carriers are desirably separated by the built in voltage of the junction. A small bias voltage may be used to cause carrier drift to the desired electrodes.

Alternatively, the electrodes may be formed of different electrically conductive materials that have different work functions. These work functions may desirably be selected such that: 1) carriers of the first type flow between first semiconductor layer 102 and one of the electrodes, e.g. first electrode 114, more easily than carriers of the first type flow between first semiconductor layer 102 and the other electrode, e.g. second electrode 116; and carriers of the second type flow between second semiconductor layer 108 and second electrode 116, more easily than carriers of the second type flow between second semiconductor layer 108 and first electrode 114. For example, silver, aluminum, and zinc all have relatively low work functions, while copper, nickel, and gold all have relatively high work functions. Thus, in an exemplary PV device in which the first carrier type is electrons and the second carrier type is holes, first electrode 114 may be formed of aluminum to induce photo-electrons separated by the junction to flow from first semiconductor layer 102 into first electrode 114 and second electrode 116 may be formed of copper to induce photo-holes separated by the junction to flow from second semiconductor layer 108 into second electrode 116.

FIG. 3 also illustrates an exemplary multilayer laterally configured electrooptical device. In the exemplary device of FIG. 3, equal numbers of layers of alternating type semiconductor materials are shown, i.e. semiconductor layers 102, 300, and 304 are formed of the first type semiconductor material and semiconductor layers 108, 302, and 306 are formed of the second type semiconductor material. A junction exists between each consecutive pair of layers. Thus, the exemplary embodiment of FIG. 3 includes five junctions, where electron-hole recombination and the emission of radiation may occur in EL application, or where electron-hole pairs may be separated in PV applications. Decreasing the thickness of the semiconductor layers while increasing the number of junctions may allow for more efficient generation of light or photocurrent in EL or PV applications, respectively.

It is noted that the layers of each semiconductor type are also shown as having the same thickness in FIG. 3; however, it is contemplated that the thickness of each semiconductor layer may be determined independently based on characteristics of the semiconductor material(s) of the layer. It is noted that the semiconductor material(s) of each layer may vary, as well as their thicknesses. The use of different semiconductor materials with different bandgaps may allow a single exemplary EL device to emit radiation at multiple wavelengths, possibly even 'white' light, or may allow a single exemplary PV device to more efficiently convert broadband radiation into photocurrent. Such designs may desirably have junctions nearer to the output surface for shorter wavelengths and junctions farther from the output surface for longer wavelengths.

Exemplary multilayer laterally configured electrooptical devices according to the present invention may also include a light transmissive insulating layer formed between sets of semiconductor layers in the multilayer semiconductor structure. For example, the exemplary device of FIG. 3 could include one light transmissive insulating layer (not shown) between second semiconductor layer 108 and third semiconductor layer 300 and another light transmissive insulating layer (not shown) between fourth semiconductor layer 302 and fifth semiconductor layer 304. The addition of these light transmissive insulating layers would allow the three pairs semiconductor layers to operate separately. This may allow for improved color control of multiple wavelength devices. It is contemplated that light transmissive insulating layers may be formed between every three semiconductor layers, every four semiconductor layers, etc. Additionally, it is contemplated that order of the types of the semiconductor layers may be changes between sets of layers that are separated by a light transmissive insulating layer. For example, an exemplary electrooptical device could be formed with a PN/insulator/NP structure.

The light transmissive insulating layer may be formed of a single layer of dielectric material. Alternatively, the light transmissive insulating layer may be formed of multiple dielectric layers to form a dielectric filter. Such a dielectric filter may transmit one desired spectrum of radiation and reflect another desired spectrum. The incorporation of such dielectric filters between the semiconductor layers of an exemplary multilayer laterally configured electrooptical device may improve the sensitivity of an exemplary multiple wavelength laterally configured PV device and/or the color control of an exemplary multiple wavelength laterally configured EL device.

FIG. 4 illustrates another exemplary laterally configured electrooptical device according to present invention. In this exemplary embodiment, substrate 100 includes gate electrode 400 and gate insulator 402. Gate insulator 402 forms the section of the surface of substrate 100 to which first semiconductor layer 102 is coupled. This gate electrode may be used to switch the exemplary electrooptical device on and off. Alternatively, gate electrode 400 may be used to adjust the output power or tune the output wavelength of an exemplary EL device, or to adjust the sensitivity of an exemplary PV device. It may also be used to switch an exemplary device from functioning as a PV device to functioning as an EL device, or vice versa.

Exemplary laterally configured electrooptical devices according to the present invention may find numerous uses in a wide variety of applications. EL applications include a number of lighting and display applications. PV applications include discrete devices, such as image sensors and solar cells, as well as being integrated into systems, such as still cameras, video cameras, and copiers. It is contemplated that in camera applications, this exemplary configuration with electrodes arranged on the sides may eliminate the need for blooming drains.

The present invention includes a number of exemplary embodiments of exemplary laterally configured electrooptical devices. Although the invention is illustrated and described herein with reference to specific embodiments, it is not intended to be limited to the details shown. Rather, various modifications may be made in the details within the scope and range of equivalents of the claims and without departing from the invention. In particular, one skilled in the art may understand that many features of the various specifically illustrated embodiments may be mixed to form additional exemplary electrooptical devices also embodied by the present invention.

What is claimed is:

1. A laterally configured electrooptical device comprising:
a substrate having a surface;
a first semiconductor layer of a first type semiconductor material, the first semiconductor layer having a first side, a second side, an upper surface, and a lower surface, the lower surface of the first semiconductor layer being coupled to a section of the surface of the substrate;
a second semiconductor layer formed of a second type semiconductor material different from the first type semiconductor material, the second semiconductor layer having a first side, a second side, an upper surface, and a lower surface arranged such that:
the lower surface of the second semiconductor layer is coupled to the upper surface of the first semiconductor layer to form a junction;
the first side of the second semiconductor layer is adjacent to the first side of the first semiconductor layer; and
the second side of the second semiconductor layer is adjacent to the second side of the first semiconductor layer;
a first electrode directly electrically connected to the first side of the first semiconductor layer; and
a second electrode directly electrically connected to the second side of the second semiconductor layer;
wherein the first electrode and the second electrode are configured such that at least one of the lower surface of the first semiconductor layer or the upper surface of the second semiconductor layer is substantially unoccluded by the first electrode and the second electrode.

2. A laterally configured electrooptical device according to claim 1, wherein the substrate includes a gate electrode and a gate insulator, the gate insulator forming the section of the surface of the substrate to which the first semiconductor layer is coupled.

3. A laterally configured electrooptical device according to claim 1, wherein the section of the surface of the substrate to which the first semiconductor layer is coupled is substantially reflective.

4. A laterally configured electrooptical device according to claim 1, wherein at least one of:
the first side of the first semiconductor layer includes a doped portion to form an ohmic contact with the first electrode; or
the second side of the second semiconductor layer includes a doped portion to form an ohmic contact with the second electrode.

5. A laterally configured electrooptical device according to claim 1, further comprising at least one of:
an insulating layer disposed between the first electrode and the first side of the second semiconductor layer; or
an insulating layer disposed between the second electrode and the second side of the first semiconductor layer.

6. A laterally configured electrooptical device according to claim 1, wherein:
the first electrode is formed of a first electrically conductive material having a first work function;
the second electrode is formed of a second electrically conductive material having a second work function; and
the first work function and the second work function are selected such that:
carriers of the first type flow between the first semiconductor layer and the first electrode more easily than carriers of the first type flow between the first semiconductor layer and the second electrode; and
carriers of the second type flow between the second semiconductor layer and the second electrode more easily than carriers of the second type flow between the second semiconductor layer and the first electrode.

7. A laterally configured electrooptical device according to claim 1, wherein:
the first type semiconductor material is one of:
an n-type organic semiconductor material;
a p-type organic semiconductor material;
a bipolar organic semiconductor material;
an n-type inorganic semiconductor material;
a p-type inorganic semiconductor material; or
an intrinsic inorganic semiconductor material;
the second type semiconductor material is one of:
an n-type organic semiconductor material;
a p-type organic semiconductor material;
a bipolar organic semiconductor material;
an n-type inorganic semiconductor material;
a p-type inorganic semiconductor material; or
an intrinsic inorganic semiconductor material.

8. A laterally configured electrooptical device according to claim 1, wherein the junction between first semiconductor layer and the second semiconductor layer is formed at a predetermined angle to the surface of the substrate.

9. A laterally configured electrooptical device according to claim 8, wherein the predetermined angle between the junction and the surface of the substrate is approximately equal to an arctangent of a maximum thickness of the first semiconductor layer divided by a width of the first semiconductor layer.

10. A laterally configured electrooptical device according to claim 1, wherein:
the laterally configured electrooptical device is an electroluminescent (EL) device; and
at least one of the first type semiconductor material or the second type semiconductor material is an EL material.

11. A laterally configured electrooptical device according to claim 10, wherein:
the radiation is generated by carrier recombination near the junction between the first semiconductor layer and the second semiconductor layer; and
at least one of:
a thickness of the first semiconductor layer is selected for efficient transmission of the generated radiation through the lower surface of the first semiconductor layer and the substrate; or
a thickness of the second semiconductor layer is selected for efficient transmission of the generated radiation through the upper surface of the second semiconductor layer.

12. A laterally configured electrooptical device according to claim 11, wherein the thickness of at least one of the first semiconductor layer or the second semiconductor layer is less than about 100 nm.

13. A laterally configured electrooptical device according to claim 1, wherein:
the laterally configured electrooptical device is an photovoltaic (PV) device; and
at least one of the first type semiconductor material or the second type semiconductor material is a PV material.

14. A laterally configured electrooptical device according to claim 13, wherein:
the radiation generates electron-hole pairs in the at least one of the first semiconductor layer or the second semiconductor layer that is formed of a PV material; and
a thickness of each of the first semiconductor layer or the second semiconductor layer that is formed of the PV material is selected for efficient separation of the generated electron-hole pairs by the junction between first semiconductor layer and the second semiconductor layer.

15. A laterally configured electrooptical device according to claim 14, wherein the thickness of each of the first semiconductor layer or the second semiconductor layer that is formed of the PV material is less than about 100 nm.

16. A laterally configured electrooptical device according to claim 1, further comprising:
a third semiconductor layer formed of the first type semiconductor material, the third semiconductor layer having a first side, a second side, an upper surface, and a lower surface arranged such that:
the lower surface of the third semiconductor layer is coupled to the upper surface of the second semiconductor layer to form another junction;
the first side of the third semiconductor layer is adjacent to the first side of the second semiconductor layer and directly electrically coupled to the first electrode; and
the second side of the third semiconductor layer is adjacent to the second side of the second semiconductor layer.

17. A laterally configured electrooptical device according to claim 16, further comprising:
a fourth semiconductor layer formed of the second type semiconductor material, the fourth semiconductor layer having a first side, a second side, an upper surface, and a lower surface arranged such that:
the lower surface of the fourth semiconductor layer is coupled to the upper surface of the third semiconductor layer to form a further junction;
the first side of the fourth semiconductor layer is adjacent to the first side of the third semiconductor layer; and
the second side of the fourth semiconductor layer is adjacent to the second side of the third semiconductor layer and directly electrically coupled to the second electrode.

18. A laterally configured electrooptical device according to claim 16, further comprising:
a light transmissive insulating layer having a first side, a second side, an upper surface, and a lower surface arranged such that the lower surface of the light transmissive insulating layer is coupled to the upper surface of the third semiconductor layer;
a fourth semiconductor layer formed of the first type semiconductor material, the fourth semiconductor layer having a first side, a second side, an upper surface, and a lower surface arranged such that:
the lower surface of the fourth semiconductor layer is coupled to the upper surface of the light transmissive insulating layer;
the first side of the fourth semiconductor layer is adjacent to the first side of the light transmissive insulating layer and directly electrically coupled to the first electrode; and
the second side of the fourth semiconductor layer is adjacent to the second side of the light transmissive insulating layer;
a fifth semiconductor layer formed of the second type semiconductor material, the fifth semiconductor layer having a first side, a second side, an upper surface, and a lower surface arranged such that:
the lower surface of the fifth semiconductor layer is coupled to the upper surface of the fourth semiconductor layer to form a further junction;
the first side of the fifth semiconductor layer is adjacent to the first side of the fourth semiconductor layer; and
the second side of the fifth semiconductor layer is adjacent to the second side of the fourth semiconductor layer and directly electrically coupled to the second electrode; and
a sixth semiconductor layer formed of the first type semiconductor material, the sixth semiconductor layer having a first side, a second side, an upper surface, and a lower surface arranged such that:
the lower surface of the sixth semiconductor layer is coupled to the upper surface of the fifth semiconductor layer;
the first side of the sixth semiconductor layer is adjacent to the first side of the fifth semiconductor layer and directly electrically coupled to the first electrode; and
the second side of the sixth semiconductor layer is adjacent to the second side of the fifth semiconductor layer.

19. A laterally configured electrooptical device according to claim 18, wherein the light transmissive insulating layer includes a plurality of dielectric layers to form a dielectric filter.

20. A laterally configured electrooptical device according to claim 1, further comprising:
- a light transmissive insulating layer having a first side, a second side, an upper surface, and a lower surface arranged such that the lower surface of the light transmissive insulating layer is coupled to the upper surface of the second semiconductor layer;
- a third semiconductor layer formed of a third type semiconductor material, the third semiconductor layer having a first side, a second side, an upper surface, and a lower surface arranged such that:
  - the lower surface of the third semiconductor layer is coupled to the upper surface of the light transmissive insulating layer;
  - the first side of the third semiconductor layer is adjacent to the first side of the second semiconductor layer and directly electrically coupled to the first electrode; and
  - the second side of the third semiconductor layer is adjacent to the second side of the second semiconductor layer; and
- a fourth semiconductor layer formed of a fourth type semiconductor material different from the third type semiconductor material, the fourth semiconductor layer having a first side, a second side, an upper surface, and a lower surface arranged such that:
  - the lower surface of the fourth semiconductor layer is coupled to the upper surface of the third semiconductor layer to form another junction;
  - the first side of the fourth semiconductor layer is adjacent to the first side of the third semiconductor layer; and
  - the second side of the fourth semiconductor layer is adjacent to the second side of the third semiconductor layer and directly electrically coupled to the second electrode.

21. A laterally configured electrooptical device according to claim 20, wherein:
- the laterally configured electrooptical device is an electroluminescent (EL) device;
- at least one of the first type semiconductor material or the second type semiconductor material is a first EL material, the first EL material adapted to emit light having a first peak wavelength; and
- at least one of the third type semiconductor material or the fourth type semiconductor material is a second EL material, the second EL material adapted to emit light having a second peak wavelength.

22. A laterally configured electrooptical device according to claim 20, wherein:
- the third type semiconductor material is the first type semiconductor material; and
- the fourth type semiconductor material is the second type semiconductor material.

23. A laterally configured electrooptical device according to claim 20, wherein:
- the third type semiconductor material is the second type semiconductor material; and
- the fourth type semiconductor material is the first type semiconductor material.

24. A laterally configured electrooptical device according to claim 20, wherein the light transmissive insulating layer includes a plurality of dielectric layers to form a dielectric filter.

25. A laterally configured electrooptical device comprising:
- a first semiconductor sheet of a first type semiconductor material, the first semiconductor sheet having a first surface, a second surface opposite the first surface, a first edge substantially perpendicular to the first surface, and a second edge opposite the first edge and substantially perpendicular to the first surface;
- a second semiconductor sheet formed of a second type semiconductor material different from the first type semiconductor material, the second semiconductor sheet having a first surface, a second surface opposite the first surface, a first edge substantially perpendicular to the second surface, and a second edge opposite the first edge and substantially perpendicular to the second surface, the first semiconductor sheet and the second semiconductor sheet being arranged such that;
  - the first surface of the second semiconductor sheet is coupled to the second surface of the first semiconductor sheet to form a junction;
  - the first side of the second semiconductor sheet is adjacent to the first side of the first semiconductor sheet; and
  - the second side of the second semiconductor sheet is adjacent to the second side of the first semiconductor sheet;
- a first electrode directly electrically connected to the first side of the first semiconductor sheet; and
- a second electrode directly electrically connected to the second side of the second semiconductor sheet;
- wherein the first electrode and the second electrode are configured such that at least one of the first surface of the first semiconductor sheet or the second surface of the second semiconductor sheet is substantially unoccluded by the first electrode and the second electrode.

26. A laterally configured electrooptical device according to claim 25, wherein:
- the first type semiconductor material is one of:
  - an n-type organic semiconductor material;
  - a p-type organic semiconductor material;
  - a bipolar organic semiconductor material;
  - an n-type inorganic semiconductor material;
  - a p-type inorganic semiconductor material; or
  - an intrinsic inorganic semiconductor material;
- the second type semiconductor material is one of:
  - an n-type organic semiconductor material;
  - a p-type organic semiconductor material;
  - a bipolar organic semiconductor material;
  - an n-type inorganic semiconductor material;
  - a p-type inorganic semiconductor material; or
  - an intrinsic inorganic semiconductor material.

* * * * *